United States Patent
Shum et al.

(10) Patent No.: US 7,732,803 B2
(45) Date of Patent: Jun. 8, 2010

(54) LIGHT EMITTING DEVICE HAVING STACKED MULTIPLE LEDS

(75) Inventors: Frank Shum, Sunnyvale, CA (US); Heng Liu, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 48 days.

(21) Appl. No.: 12/130,824

(22) Filed: May 30, 2008

(65) Prior Publication Data

US 2009/0272989 A1 Nov. 5, 2009

Related U.S. Application Data

(60) Provisional application No. 61/049,633, filed on May 1, 2008.

(51) Int. Cl.
*H01L 31/00* (2006.01)

(52) U.S. Cl. ............... 257/13; 257/94; 257/99; 257/E25.032; 257/E51.022; 438/22; 438/28; 438/47

(58) Field of Classification Search ............ 257/13, 257/79–103, 918, E25.032, E51.022; 438/22, 438/24, 28, 46, 47
See application file for complete search history.

(56) References Cited

U.S. PATENT DOCUMENTS

2008/0251799 A1* 10/2008 Ikezawa .............. 257/89

* cited by examiner

*Primary Examiner*—Evan Pert
*Assistant Examiner*—Scott R Wilson
(74) *Attorney, Agent, or Firm*—Arent Fox LLP

(57) ABSTRACT

A light emitting device and method of producing the same is disclosed. The light emitting device includes a heterostructure having a plurality of light emitting diodes (LEDs) stacked one on top of another.

30 Claims, 4 Drawing Sheets

LIGHT EMITTING DEVICE HAVING STACKED MULTIPLE LEDS

CROSS-REFERENCE TO RELATED APPLICATION

The present application for patent claims priority under 35 U.S.C. §119 to Provisional Application No. 61/049,633 entitled, "Light Emitting Device Having Stacked Multiple LEDs," filed May 1, 2008.

BACKGROUND

1. Field

The present disclosure relates to light emitting devices, and more particularly, to semiconductor light emitting devices having stacked multiple light emitting diodes (LEDs).

2. Background

A light emitting diode (LED) is a forward-biased p-n junction generating photons by spontaneous electron-hole pair recombination. After decades of development, LED technology has been greatly advanced by improved materials, new manufacturing systems, and novel structures.

Due to the success and the great potential of the LED technology, LEDs have become one of the most important light sources for next generation illumination. Nevertheless, for illuminating applications, it is necessary to enhance the luminance (brightness) of LEDs.

Luminance is generally defined by the equation $L=\Phi/(A\Omega)$. Where L is the luminance, $\Phi$ is the luminous flux (luminous power), A is the area of the light emitting surface, and $\Omega$ is the solid angle. To increase LED luminance, many contemporary devices have implemented higher operating current densities to increase the luminous flux $\Phi$.

Unfortunately, increasing the operating current density may result in various undesired effects. One of the constraints of increasing the current density is the inability to effectively spread the electric current uniformly over the entire area. Consequently, the majority of current may only flow through a few isolated regions of the area. The isolated regions may exhibit current crowding and overheating. The heat, if not sufficiently dissipated, may cause premature degradation of the LED, decreasing its performance and life-span.

In addition to causing premature degradation of the LED due to overheating, a large current density may actually cause the luminous flux $\Phi$ to "roll over" and decrease the brightness of an LED, thus, decreasing the efficiency of the LED.

Accordingly, although contemporary LEDs have proven generally suitable for their intended purposes, they possess inherent deficiencies which detract from their overall effectiveness and desirability. As such, there exists a need for LEDs that occupy a small semiconductor footprint and provide a high luminance without the aforementioned deficiencies of contemporary devices.

SUMMARY

In one aspect of the disclosure, a light emitting device includes a plurality of light emitting diodes (LEDs) stacked one on top of another so as to form a layered structure.

In another aspect of the disclosure, a method for producing a light emitting device, includes stacking a plurality of light emitting diodes (LEDs) one on top of another so as to form a layered structure.

In a further aspect of the disclosure, a method for producing light from a light emitting device having a plurality of light emitting diodes (LEDs), wherein the plurality of LEDs are stacked one on top of another so as to form a layered structure, and wherein each of the LEDs includes a n-type semiconductor layer and a p-type semiconductor layer, the method includes applying a voltage to the n-type semiconductor layer of at least one of the LEDs, and applying the voltage to the n-type semiconductor layer of at least another one of the LEDs.

In yet a further aspect of the disclosure, an apparatus includes a plurality of light emitting devices, wherein each of the devices includes a plurality of light emitting diodes (LEDs) stacked one on top of another so as to form a layered structure.

It is understood that other aspects of the present disclosure will become readily apparent to those skilled in the art from the following detailed description, wherein it is shown and described only examples of various aspects of the disclosure by way of illustration. As will be realized, the disclosure includes other and different aspects and its several details are capable of modification in various other respects, all without departing from the spirit and scope of the present disclosure. Accordingly, the drawings and detailed description that follow are to be regarded as illustrative in nature and not as restrictive.

BRIEF DESCRIPTION OF THE DRAWINGS

Various aspects of the present disclosure are illustrated by way of example, and not by way of limitation, in the accompanying drawings, wherein.

DETAILED DESCRIPTION

The detailed description set forth below in connection with the appended drawings is intended as a description of various aspects of the present invention and is not intended to represent all ways in which the present invention may be practiced. The detailed description may include specific details for the purpose of providing a thorough understanding of the present invention; however, it will be apparent to those skilled in the art that the present invention may be practiced without these specific details. In some instances, well-known structures and components are summarily described and/or shown in block diagram form in order to avoid obscuring the concepts of the present invention.

Figure 1A:
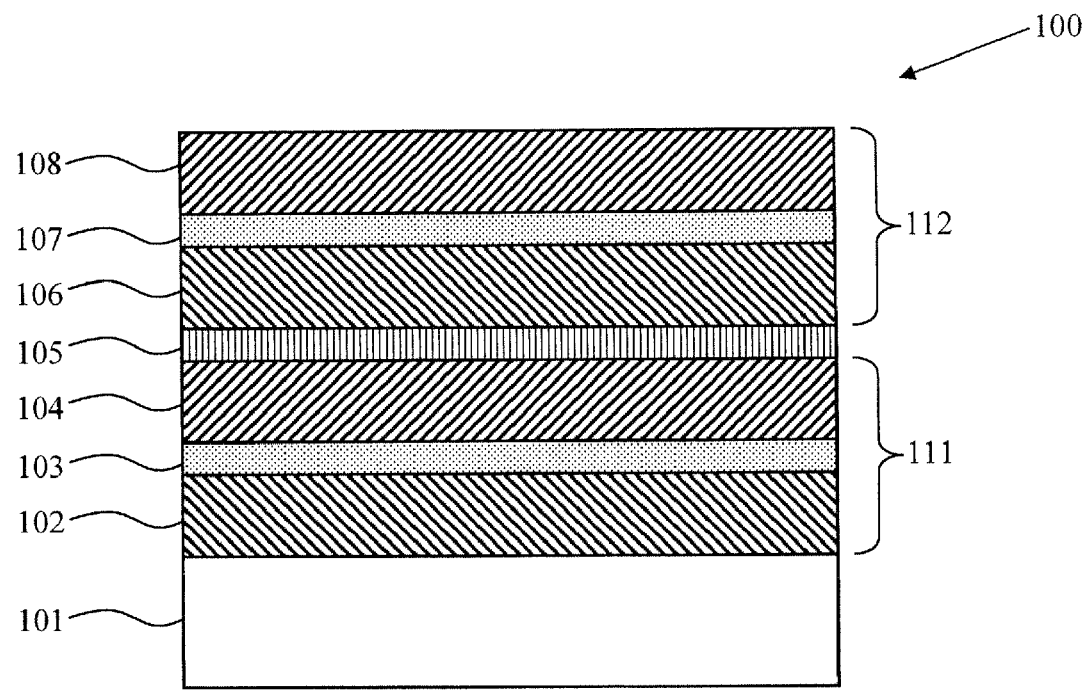
FIG. 1A is a cross-section view illustrating an example of a device having a stacked multiple LED structure.

FIG. 1A is a cross-section view illustrating an example of a device 100 having a stacked multiple light emitting diode (LED) structure. In this example, the device 100 may include two LEDs 111 and 112 successively stacked on a substrate 101. The substrate 101 may be an insulating substrate (e.g., sapphire), a conductive substrate (e.g., silicon, GaAs, InP, GaP, SiC, and ZnO), a metal substrate, or any other transparent and/or conductive substrate. The LEDs 111 and 112 may each have a heterostructure formed by metal-organic phase epitaxy, or by some other means. The heterostructure includes a p-type semiconductor layer and a n-type semiconductor layer that sandwich an active light emitting region. As shown in FIG. 1A, the LED 111 includes an n-type semiconductor layer 102 provided on the substrate 101, a p-type semiconductor layer 104 provided on the n-type semiconductor layer 102, and an active light emitting region 103 formed at the p-n junction between the n-type semiconductor layer 102 and the p-type semiconductor layer 104. Likewise, the LED 112 includes a p-type semiconductor layer 108 provided on an n-type semiconductor layer 106 and an active light emitting region 107 formed therebetween. An ohmic contact layer 105 may be provided between the p-type semiconductor layer 104 of the LED 111 and the n-type semiconductor layer 106 of the LED 112, electrically and physically coupling the LEDs 111 and 112. The ohmic contact layer 105 may be formed of an electrically conductive and optically transparent material, such as indium tin oxide (ITO).

Although the device 100 is illustrated as having a stacked structure of n-type and p-type semiconductor layers in the order of p-type, n-type, p-type, n-type (PNPN) from top to bottom, the p-type and n-type layers may be interchanged to form a NPNP structure, for example.

A reflective layer (not shown) may also be provided below the LED 111, on either side of the substrate 101, for reflecting the light produced by both of the LEDs 111 and 112 back toward the top surface (i.e., light emitting surface) of the LED 112. The reflective layer acts as a mirror and can be made of aluminum, silver, or some other reflective material. Furthermore, certain regions of the LEDs 111 and 112 may be metallized to form respective electrodes (not shown) to drive the device 100. For example, an electrode may be readily formed on the exposed top surface of the p-type semiconductor layer 108 of the LED 112. An electrode on the n-type semiconductor layer 102 of the LED 111 may be formed by removing a portion of the p-type semiconductor layer 104 by means well known in the art to expose the n-type semiconductor layer 102 and form the respective electrode thereon.

Figure 1B:
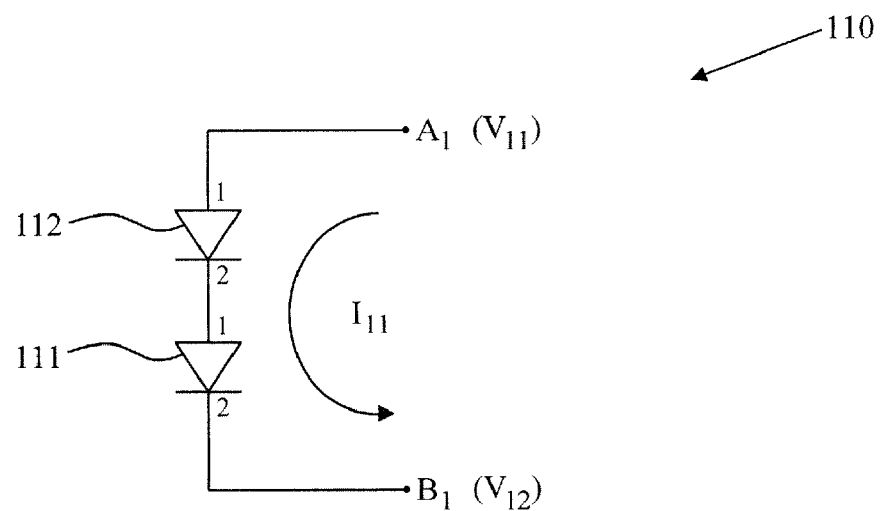
FIG. 1B is a schematic of an equivalent circuit of the device structure illustrated in FIG. 1A.

FIG. 1B is a schematic of an equivalent circuit 110 of the device 100 illustrated in FIG. 1A. Having electrodes connected to the n-type semiconductor layer 102 of the LED 111 and the p-type semiconductor layer 108 of the LED 112, respectively, results in a series connection of the LEDs 111 and 112, as exemplified by the circuit 110.

As shown in FIG. 1B, terminal 1 of the LED 112 is coupled to a node $A_1$ and corresponds to the electrode at the p-type semiconductor layer 108; terminal 2 of the LED 111 is coupled to a node $B_1$ and corresponds to the electrode at the n-type semiconductor layer 102; and terminals 1 and 2 of the LEDs 111 and 112, respectively, are coupled to each other and correspond to the ohmic contact layer 105. Voltages $V_{11}$ and $V_{12}$ ($V_{11} \geq V_{12}$) may be applied to nodes $A_1$ and $B_1$, respectively, to create a forward voltage $V_f$ across the LEDs 111 and 112 and induce a current $I_{11}$ through the LEDs 111 and 112. When the forward voltage $V_f$ is applied across the LEDs 111 and 112, electrons and holes from the n-type and p-type semiconductor layers 102, 104, 106, and 108, respectively, are forced into their respective active light emitting regions 103 and 107 and recombine, thereby releasing energy in the form of light. Voltages $V_{11}$ and $V_{12}$ may be controlled to adjust the luminance of the device 100 by varying the amount of current $I_{11}$ flowing through the LEDs 111 and 112.

When the LEDs 111 and 112 produce light in the stacked structure, as shown in FIG. 1A, the amount of light emitted from the light emitting surface area (luminous flux $\Phi$) may be substantially greater than that produced by only a single LED. Consequently, this increase in the luminous flux $\Phi$ results in a proportional increase in the luminance of the device 100.

Figure 2A:
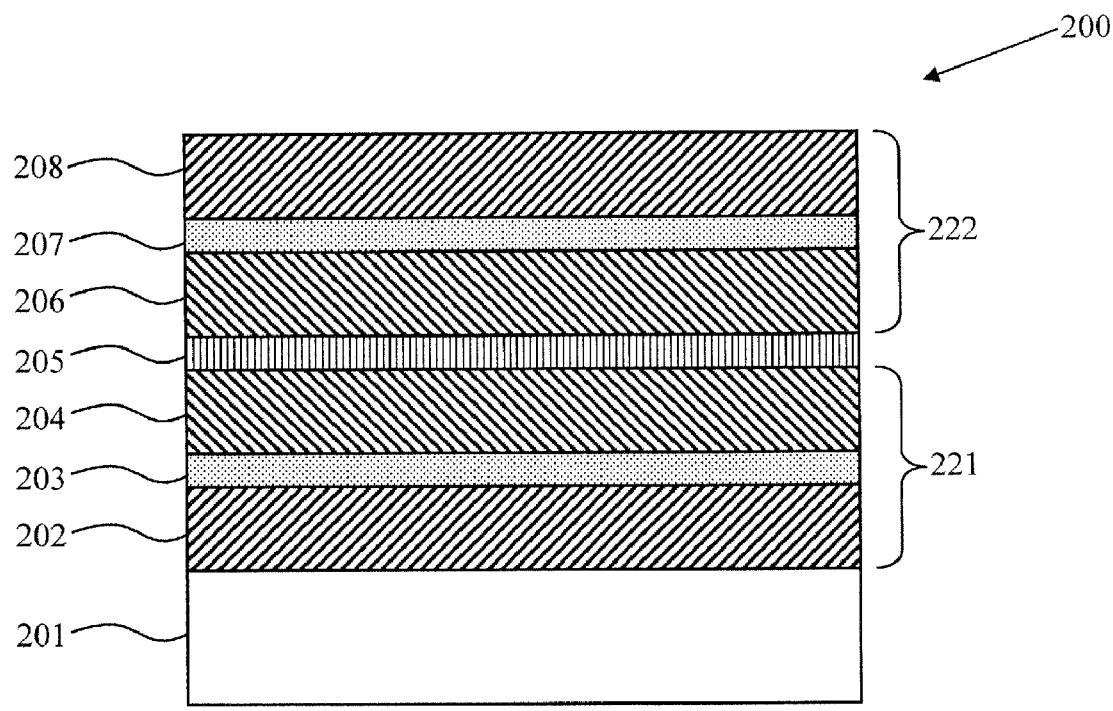
FIG. 2A is a cross-section view illustrating another example of a device having a stacked multiple LED structure.

FIG. 2A is a cross-section view illustrating another example of a device 200 having a stacked multiple LED structure. In this example, the device 200 may include two LEDs 221 and 222 successively stacked on a substrate 201. The substrate 201 may be similar to the substrate 101 shown in FIG. 1A. The LEDs 221 and 222, similar to the LEDs 111 and 112 shown in FIG. 1A, may each have a heterostructure formed by metal-organic phase epitaxy, or by some other means. As shown in FIG. 2A, the LED 221 includes a p-type semiconductor layer 202 provided on the substrate 201, a n-type semiconductor layer 204 provided on the p-type semiconductor layer 202, and an active light emitting region 203 formed at the p-n junction between the p-type semiconductor layer 202 and the n-type semiconductor layer 204. Likewise, the LED 222 includes a p-type semiconductor layer 208 provided on a n-type semiconductor layer 206 and an active light emitting region 207 formed therebetween. An ohmic contact layer 205 may be provided between the n-type semiconductor layer 204 of the LED 221 and the n-type semiconductor layer 206 of the LED 222, electrically and physically coupling the LEDs 221 and 222. The ohmic contact layer 205 may be formed of an electrically conductive and optically transparent material, such as ITO.

Although the device 200 is illustrated as having a stacked structure of n-type and p-type semiconductor layers in the order of p-type, n-type, n-type, p-type (PNNP) from top to bottom, the p-type and n-type layers may be interchanged to form a NPPN structure, for example.

A reflective layer (not shown) may also be provided below the LED 221, on either side of the substrate 201, for reflecting the light produced by both of the LEDs 221 and 222 back toward the top surface (i.e., light emitting surface) of the LED 222. The reflective layer acts as a mirror and can be made of aluminum, silver, or some other reflective material. Furthermore, certain regions of the LEDs 221 and 222 may be metallized to form respective electrodes (not shown) to drive the device 200. For example, an electrode may be readily formed on the exposed top surface of the p-type semiconductor layer 208 of the LED 222. Another electrode on the p-type semiconductor layer 202 of the LED 221 may be formed by removing a portion of the n-type semiconductor layer 204 by means well known in the art to expose the p-type semiconductor layer 202 and form the respective electrode thereon. Likewise, an electrode may also be formed on the ohmic contact layer 205 or on one of the n-type semiconductor layers 204 and 206.

Figure 2B:
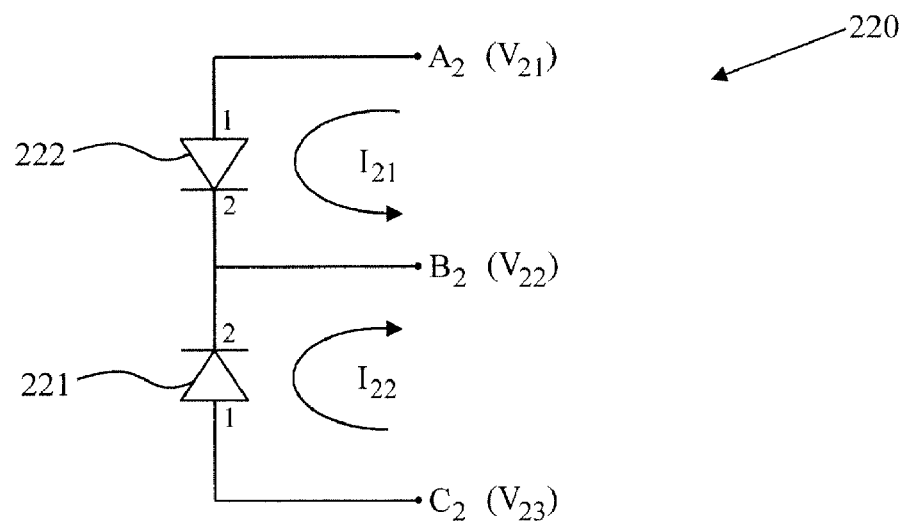
FIG. 2B is a schematic of an equivalent circuit of the device structure illustrated in FIG. 2A.

FIG. 2B is a schematic of an equivalent circuit 220 of the device 200 illustrated in FIG. 2A. As shown in FIG. 2B, terminal 1 of the LED 222 is coupled to a node $A_2$ and corresponds to the electrode at the p-type semiconductor layer 208; terminals 2 of the LEDs 221 and 222 are coupled to each other and a node $B_2$ and correspond to the electrode at the ohmic contact layer 205; and terminal 1 of the LED 221 is coupled to a node $C_2$ and corresponds to the electrode at the p-type semiconductor layer 202. Voltages $V_{21}$, $V_{22}$, and $V_{23}$ ($V_{21}$, $V_{23} \geq V_{22}$) may be applied to nodes $A_2$, $B_2$, and $C_2$, respectively, to create respective forward voltages $V_f$ across the LEDs 221 and 222 and induce currents $I_{21}$ and $I_{22}$ through the LEDs 222 and 221, respectively.

When the LEDs 221 and 222 of circuit 220 produce light in the stacked structure, as shown in FIG. 2A, the amount of light emitted from the light emitting surface area (luminous flux $\Phi$) may be substantially greater than that produced by only a single LED. Consequently, this increase in the luminous flux Φ results in a proportional increase in the luminance of the device 200.

In addition, the voltages $V_{21}$, $V_{22}$, and $V_{23}$ at nodes $A_2$, $B_2$, and $C_2$, respectively, may be independently varied to control the luminance of each of the LEDs 221 and 222. For example, the luminance of the LED 222 may be increased and the luminance of the LED 221 may be decreased by increasing the voltages $V_{21}$ and $V_{23}$ and maintaining the voltage $V_{22}$ at a substantially constant value. As the voltage $V_{21}$ increases while the voltage $V_{22}$ remains constant, the potential difference across the LED 222 will increase, increasing the current $I_{21}$ through the LED 222, and in turn, increasing the luminance of the LED 222. Concurrently or subsequently, as the voltage $V_{23}$ increases while the voltage $V_{22}$ remains constant, the potential difference across the LED 221 will decrease, decreasing the current $I_{22}$ through the LED 221, and in turn, decreasing the luminance of the LED 221. In this way, the circuit 220 may provide independent control of the luminance of each of the LEDs 221 and 222. Such control is useful when tuning the brightness of the device 200 or adjusting a color of the light output from the combination of the LEDs 221 and 222 (color-mixing), should the LEDs 221 and 222 produce light of different colors.

Figure 3A:
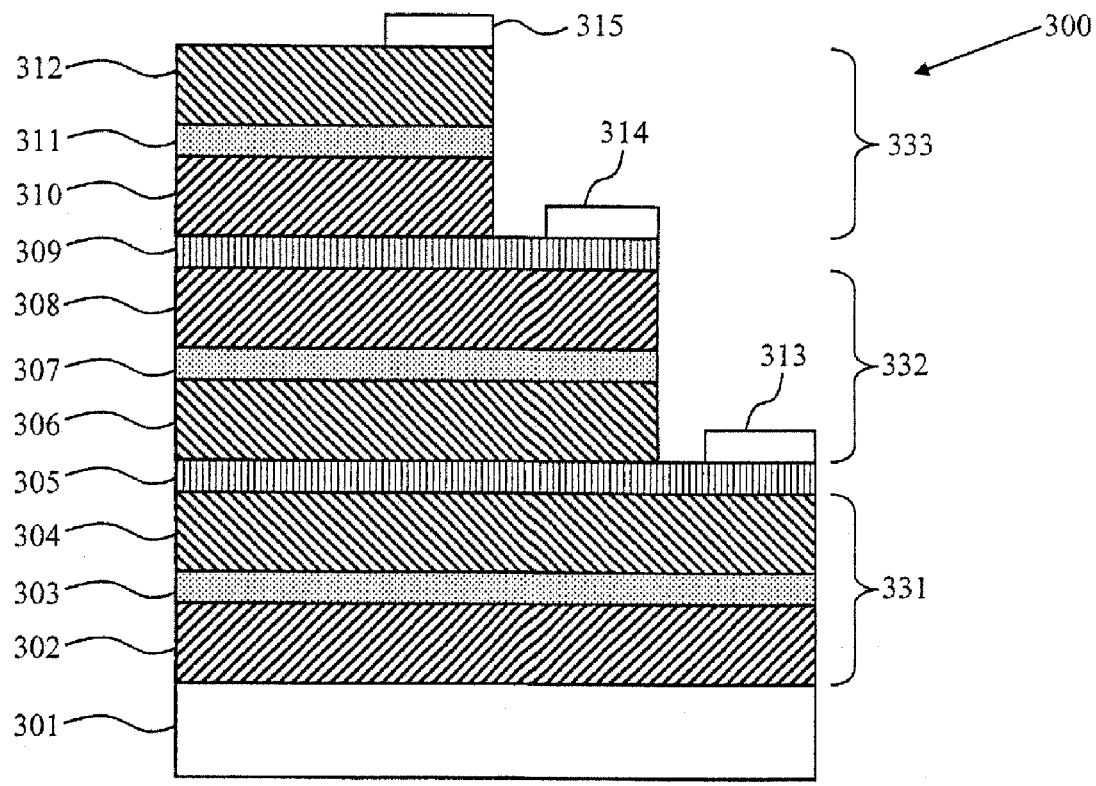
FIG. 3A is a cross-section view illustrating yet another example of a device having a stacked multiple LED structure.

FIG. 3A is a cross-section view illustrating an example of yet another device 300 having a stacked multiple LED structure. In this example, the device 300 may include three LEDs 331, 332, and 333 successively stacked on a substrate 301. The substrate 301 may be similar to the substrate 101 shown in FIG. 1A. The LEDs 331, 332, and 333, similar to the LEDs 111 and 112 shown in FIG. 1A, may each have a heterostructure formed by metal-organic phase epitaxy, or by some other means. As shown in FIG. 3A, the LED 331 includes a p-type semiconductor layer 302 provided on the substrate 301, a n-type semiconductor layer 304 provided on the p-type semiconductor layer 302, and an active light emitting region 303 formed at the p-n junction between the p-type semiconductor layer 302 and the n-type semiconductor layer 304. Likewise, the LED 332 includes a p-type semiconductor layer 308 provided on a n-type semiconductor layer 306 and an active light emitting region 307 formed therebetween. Similarly, the LED 333 includes a n-type semiconductor layer 312 provided on a p-type semiconductor layer 310 and an active light emitting region 311 formed therebetween. An ohmic contact layer 305 may be provided between the n-type semiconductor layer 304 of the LED 331 and the n-type semiconductor layer 306 of the LED 332, electrically and physically coupling the LEDs 331 and 332. Likewise, an ohmic contact layer 309 may be provided between the p-type semiconductor layer 308 of the LED 332 and the p-type semiconductor layer 310 of the LED 333, electrically and physically coupling the LEDs 332 and 333. The ohmic contact layers 305 and 309 may be formed of an electrically conductive and optically transparent material, such as ITO.

Although the device 300 is illustrated as having a stacked structure of n-type and p-type semiconductor layers in the order of n-type, p-type, p-type, n-type, n-type, p-type (NPP-NNP) from top to bottom, the p-type and n-type layers may be interchanged to form a PNNPPN structure, for example. Further, although the device 300 is illustrated as having only the three stacked LEDs 331, 332, and 333, the device 300 may have more than three stacked LEDs.

A reflective layer (not shown) may also be provided below the LED 331 for reflecting the light produced by the LEDs 331, 332, and 333 back toward the top surface (i.e., light emitting surface) of the LED 333. The reflective layer acts as a mirror and can be made of aluminum, silver, or some other reflective material. Furthermore, certain regions of the LEDs 331, 332, and 333 may be metallized to form respective electrodes to drive the device 300. For example, an electrode 315 may be readily formed on the exposed top surface of the n-type semiconductor layer 312 of the LED 333. An electrode 314 may be formed on the ohmic contact layer 309 or on one of the p-type semiconductor layers 308 and 310 by removing portions of the layers above the region where the electrode 314 is to be formed. Likewise, an electrode 313 may be formed on the ohmic contact layer 305 or on one of the n-type semiconductor layers 304 and 306. An additional electrode (not shown) may be provided on the p-type semiconductor layer 302 or the substrate 301, in which case the substrate 301 may be a conductive substrate.

Figure 3B:
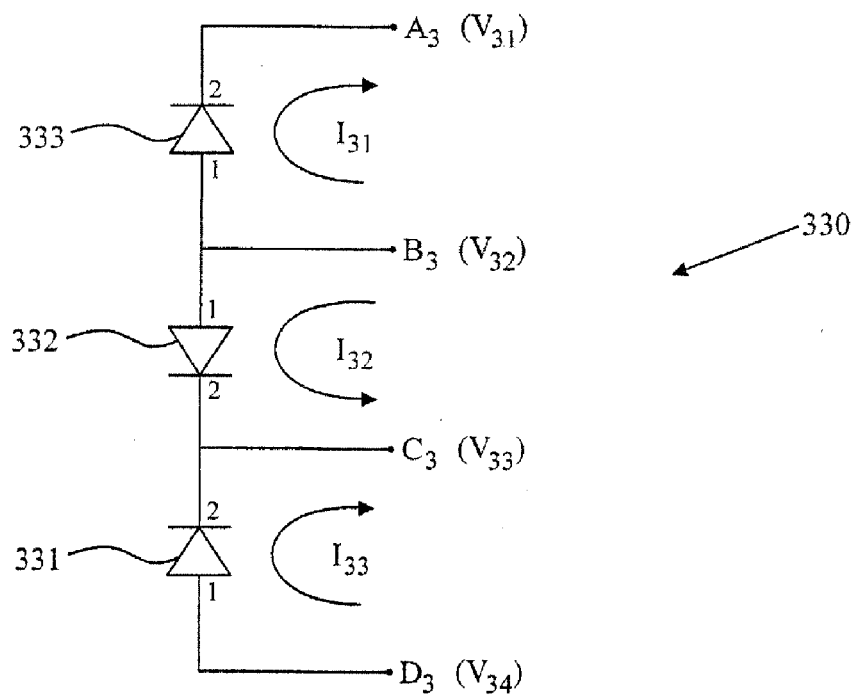
FIG. 3B is a schematic of an equivalent circuit of the device structure illustrated in FIG. 3A.

FIG. 3B is a schematic of an equivalent circuit 330 of the device 300 illustrated in FIG. 3A. As shown in FIG. 3B, terminal 2 of the LED 333 is coupled to a node $A_3$ and corresponds to the electrode 315; terminals 1 of the LEDs 332 and 333 are coupled to each other and a node $B_3$ and correspond to the electrode 314; terminals 2 of the LEDs 331 and 332 are coupled to each other and a node $C_3$ and correspond to the electrode 313; and terminal 1 of the LED 331 is coupled to a node $D_3$ and corresponds to the electrode at the p-type semiconductor layer 302 or the conductive substrate 301. Voltages $V_{31}$, $V_{32}$, $V_{33}$, and $V_{34}$ ($V_{32}$, $V_{34} \geq V_{31}$, $V_{33}$) may be applied to nodes $A_3$, $B_3$, $C_3$, and $D_3$, respectively, to create respective forward voltages $V_f$ across the LEDs 331, 332, and 333 and induce currents $I_{31}$, $I_{32}$, and $I_{33}$ through the LEDs 333, 332, and 331, respectively.

When the LEDs 331, 332, and 333 of circuit 330 produce light in the stacked structure, as shown in FIG. 3A, the amount of light emitted from the light emitting surface area (luminous flux Φ) may be substantially greater than that produced by only a single LED. Consequently, this increase in the luminous flux Φ results in a proportional increase in the luminance of the device 300.

In addition, the voltages $V_{31}$, $V_{32}$, $V_{33}$, and $V_{34}$ at nodes $A_3$, $B_3$, $C_3$, and $D_3$, respectively, may be independently varied to control the luminance of each of the LEDs 331, 332, and 333. For example, the luminance of the LED 333 may be increased and the luminance of the LEDs 331 and 332 may be decreased by decreasing the voltage $V_{31}$, increasing the voltage $V_{33}$, and maintaining the voltages $V_{32}$ and $V_{34}$ at a substantially constant value. As the voltage $V_{31}$ decreases while the voltage $V_{32}$ remains constant, the potential difference across the LED 333 will increase, increasing the current $I_{31}$ through the LED 333, and in turn, increasing the luminance of the LED 333. Concurrently or subsequently, as the voltage $V_{33}$ increases while the voltages $V_{32}$ and $V_{34}$ remain constant, the potential difference across the LEDs 331 and 332 will decrease, decreasing the currents $I_{32}$ and $I_{33}$ through the LEDs 332 and 331, respectively, and in turn, decreasing the luminance of the LEDs 331 and 332. In this way, the circuit 330 may provide independent control of the luminance of each of the LEDs 331, 332, and 333. Such control is useful when tuning the brightness of the device 300 or adjusting a color of the light output from the combination of the LEDs 331, 332, and 333 (color-mixing), should the LEDs 331, 332, and 333 produce light of different colors, such as red, green, blue, and white.

FIGS. 4A-4D are cross-section views illustrating some steps in the process for fabricating a stacked multiple LED structure, such as the device 100 shown in FIG. 1A. Some steps, such as the deposition of electrodes, are not shown to avoid obscuring the illustration; however, it would be clear to those of ordinary skill in the art that additional steps may be performed in the process for fabricating the stacked multiple LED structure.

Figure 4A:
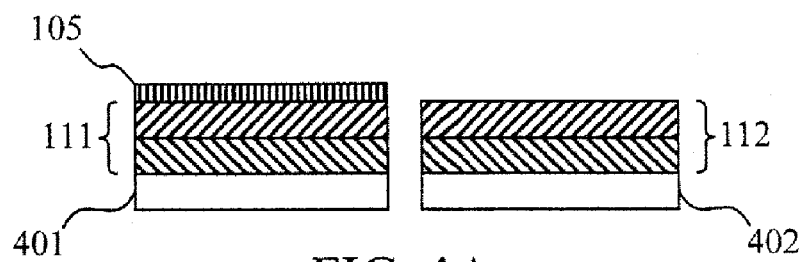
FIGS. 4A-4D are cross-section views illustrating some steps in the process for fabricating a stacked multiple LED structure.
Figure 4B:
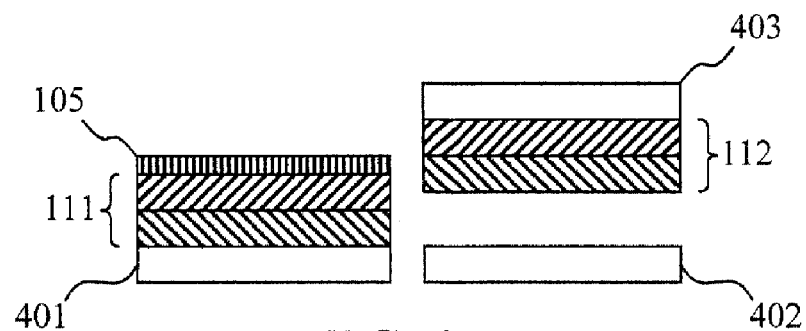
Figure 4C:
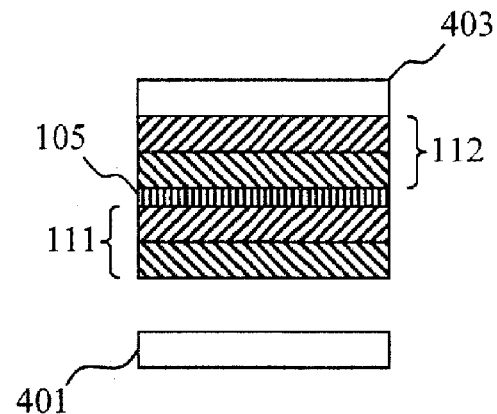
Figure 4D:
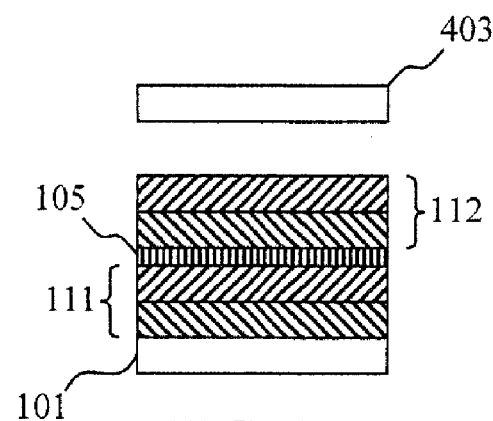

As shown in FIG. 4A, each of the LEDs 111 and 112 may be separately fabricated on their respective temporary substrates 401 and 402 or fabricated on the same substrate according to well known principles. The ohmic contact layer 105 may be provided on the LED 111. As shown in FIG. 4B, the LED 112 may then be lifted off of the substrate 402 via a temporary substrate 403. Thereafter, as shown in FIG. 4C, the LED 112 may be stacked on top of the LED 111 with the ohmic contact layer 105 therebetween to form a stacked multiple LED structure. The stacked structure may then be lifted off of the substrate 401 via the temporary substrate 403. Finally, as shown in FIG. 4D, the stacked structure of the LEDs 111 and 112 may be stacked on top of the substrate 101 and separated from the temporary substrate 403 to form device 100, as shown in FIG. 1A.

A stacked multiple LED structure may be used in numerous applications. By way of example, these LEDs may be well suited for liquid crystal display (LCD) backlighting applications. Other applications may include, but are not limited to, automobile interior lighting, light bulbs, lanterns, streetlights, flashlights, or any other application where multiple LEDs are used.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light emitting device, comprising:
a heterostructure having a plurality of light emitting diodes (LEDs) stacked one on top of another, each of the LEDs comprising a p-type semiconductor layer, an n-type semiconductor layer, and an active layer between and in contact with the p-type semiconductor layer and the n-type semiconductor layer,
wherein the LEDs are stacked without an intervening substrate layer.

2. The light emitting device of claim 1, wherein each of the LEDs is configured to be independently biased.

3. The light emitting device of claim 1, wherein each of the LEDs has independently controllable light output.

4. The light emitting device of claim 1, further comprising an ohmic contact layer provided between two of the LEDs.

5. The light emitting device of claim 1, further comprising a substrate, wherein the LEDs are provided on one side of the substrate.

6. The light emitting device of claim 5, wherein the substrate is conductive and transparent.

7. The light emitting device of claim 6, wherein at least one of the LEDs is configured to be biased through the substrate.

8. The light emitting device of claim 6, further comprising a reflective surface provided on a side of the substrate that is opposite the side on which the LEDs are provided.

9. The light emitting device of claim 1, wherein the light emitting device emits light when a voltage applied to the n-type semiconductor layer of at least one of the LEDs is equal to a voltage applied to the n-type semiconductor layer of at least another one of the LEDs.

10. The light emitting device of claim 9, wherein the light emitting device emits light when a voltage applied to the p-type semiconductor layer of at least one of the LEDs is equal to a voltage applied to the p-type semiconductor layer of at least another one of the LEDs.

11. The light emitting device of claim 1, wherein the light emitting device emits light when a direction of flow of an electric current across a p-n junction of at least one of the LEDs is opposite to a direction of flow of an electric current across a p-n junction of at least another one of the LEDs.

12. The light emitting device of claim 1, wherein each of the LEDs emits a light of a different wavelength.

13. The stacked LED of claim 1, further comprising a common electrode coupled between the first LED and the second LED.

14. A method for producing a light emitting device, comprising:
forming a plurality of light emitting diodes (LEDs), each of the LEDs comprising a p-type semiconductor layer, an n-type semiconductor layer, an active layer between and in contact with the p-type semiconductor layer and the n-type semiconductor layer, and a substrate layer in contact with one of the p-type semiconductor layer or the n-type semiconductor layer;
removing at least one substrate layer of at least one of the LEDs; and
stacking the LEDs one on top of another without an intervening substrate layer between each of the LEDs, the LEDs being stacked so as to form a layered structure.

15. The method of claim 14, further comprising configuring each of the LEDs to be independently biased.

16. The method of claim 14, further comprising configuring each of the LEDs to have independently controllable luminance.

17. The method of claim 14, further comprising providing an ohmic contact layer between two of the LEDs.

18. The method of claim 14, further comprising providing the LEDs on one side of a substrate.

19. The method of claim 18, wherein the substrate is conductive and transparent.

20. The method of claim 19, further comprising configuring at least one of the LEDs to be biased through the substrate.

21. The method of claim 19, further comprising providing a reflective surface on a side of the substrate that is opposite the side on which the LEDs are provided.

22. A method for producing light from a light emitting device having a plurality of light emitting diodes (LEDs), wherein the plurality of LEDs are stacked one on top of another so as to form a layered structure, and wherein each of the LEDs includes a n- type semiconductor layer and a p-type semiconductor layer, the method comprising:
applying a first voltage to one of the p-type semiconductor layer or the n-type semiconductor layer of a first LED of the LEDs through a common electrode coupled between the first LED and a second LED of the LEDs; and applying the first voltage to one of the p-type semiconductor layer or the n-type semiconductor layer of the second LED through the common electrode.

23. The method of claim 22, further comprising:
applying a second voltage to one of the n-type semiconductor layer or the p-type semiconductor layer of the second LED of the LEDs through a second common electrode coupled between the second LED and a third LED of the LEDs; and
applying the second voltage to one of the n-type semiconductor layer or the p-type semiconductor layer of the third LED through the second common electrode.

24. The method of claim 23, wherein the light emitting device has a NPPNNP layered structure and the second voltage is applied through the second common electrode to the p-type semiconductor layer of the second LED and the p-type semiconductor layer of the third LED.

25. The method of claim 22, further comprising:
inducing a first electric current across a p-n junction of the first LED; and
inducing a second electric current across a p-n junction of the second LED,
wherein a direction of flow of the first electric current is opposite to a direction of flow of the second electric current.

26. The method of claim 22, further comprising causing each of the LEDs to emit a light of a different wavelength.

27. The method of claim 22, wherein the light emitting device has a PNNP layered structure and the first voltage is applied through the common electrode to the n-type semiconductor layer of the first LED and the n-type semiconductor layer of the second LED.

28. A stacked light emitting device (LED), comprising:
a first LED comprising a p-type layer, an n-type layer, and an active layer between and contacting with the p-type layer and the n-type layer;
a second LED comprising a p-type layer, an n-type layer, and an active layer between and contacting with the p-type layer and the n-type layer; and
an ohmic contact layer between and contacting with one of the p-type layer or the n-type layer of the first LED and one of the p-type layer or the n-type layer of the second LED.

29. A method for producing a light emitting device (LED), comprising:
forming a first LED with a first LED p-type layer, a first LED n-type layer, an active layer between and contacting with the first LED p-type layer and the first LED n-type layer, and a first LED substrate layer contacting the first LED n-type layer;
forming a second LED with a second LED p-type layer, a second LED n-type layer, an active layer between and contacting with the second LED p-type layer and the second LED n-type layer, and a second LED substrate layer contacting the second LED n-type layer;
forming an ohmic contact layer on the first LED p-type layer;
removing the second LED substrate layer; and
stacking the second LED onto the first LED with the second LED n-type layer contacting the ohmic contact layer.

30. The method of claim 29, comprising:
forming a temporary substrate layer on the second LED p-type layer before removing the second LED substrate layer;
removing the first LED substrate layer;
forming a new substrate layer on the first LED n-type layer; and
removing the temporary substrate layer.

* * * * *